United States Patent
Kwon

(10) Patent No.: US 7,295,586 B2
(45) Date of Patent: Nov. 13, 2007

(54) CARBON DOPED GAASSB SUITABLE FOR USE IN TUNNEL JUNCTIONS OF LONG-WAVELENGTH VCSELS

(75) Inventor: Hoki Kwon, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 597 days.

(21) Appl. No.: 10/078,473

(22) Filed: Feb. 21, 2002

(65) Prior Publication Data

US 2003/0156610 A1  Aug. 21, 2003

(51) Int. Cl.
*H01S 5/00* (2006.01)
(52) U.S. Cl. .............................. 372/45.01; 372/46.011
(58) Field of Classification Search ................. 372/43, 372/45, 46
See application file for complete search history.

(56) References Cited

U.S. PATENT DOCUMENTS

| | | | | |
|---|---|---|---|---|
| 4,430,151 A | * | 2/1984 | Tsukada | ...................... 438/16 |
| 4,445,218 A | | 4/1984 | Coldren | |
| 4,451,691 A | * | 5/1984 | Fraas | ......................... 136/249 |
| 4,608,697 A | | 8/1986 | Coldren | |
| 4,622,672 A | | 11/1986 | Coldren et al. | |
| 4,829,347 A | | 5/1989 | Cheng et al. | |
| H000667 H | * | 9/1989 | Bedair et al. | ................ 136/249 |
| 4,873,696 A | | 10/1989 | Coldren et al. | |
| 4,896,325 A | | 1/1990 | Coldren | |
| 5,045,499 A | | 9/1991 | Nishizawa et al. | |
| 5,082,799 A | | 1/1992 | Holmstrom et al. | |
| 5,245,622 A | | 9/1993 | Jewell et al. | |
| 5,251,225 A | | 10/1993 | Eglash et al. | |
| 5,266,814 A | * | 11/1993 | Inata et al. | .................... 257/25 |
| 5,268,582 A | * | 12/1993 | Kopf et al. | ..................... 257/15 |
| 5,293,392 A | | 3/1994 | Shieh et al. | |
| 5,343,487 A | | 8/1994 | Scott et al. | |
| 5,349,201 A | * | 9/1994 | Stanchina et al. | ............. 257/18 |
| 5,358,880 A | | 10/1994 | Lebby et al. | |
| 5,365,540 A | | 11/1994 | Yamanaka | |

(Continued)

FOREIGN PATENT DOCUMENTS

EP   0 715 357 A1   6/1996

(Continued)

OTHER PUBLICATIONS

B.T. McDermott et al., Appl. Phys. Lett.68,1386 (1996), "Growth and doping of GaAsSb vis MOCVD for InP HBTs".*

(Continued)

*Primary Examiner*—Michael Dung Nguyen
(74) *Attorney, Agent, or Firm*—Workman Nydegger

(57) ABSTRACT

$GaAs_{(1-x)}Sb_x$ layers are grown by MOCVD. For lattice matching with InP, x is set to 0.5, while beneficial alternatives include setting x to 0.23, 0.3, and 0.4. During MOVCD, TMGa (or TEGa), TMSb, and $AsH_3$ (or TBAs) are used to fabricate the $GaAs_{(1-x)}Sb_x$ layer. Beneficially, the $GaAs_{(1-x)}Sbx$ layer's composition is controlled by the ratio of As to Sb. The MOCVD growth temperature is between 500° C. and 650° C. The $GaAs_{(1-x)}Sb_x$ layer is beneficially doped using $CCl_4$ or $CBr_4$. A heavily doped $GaAs_{(1-x)}Sb_x$ layer can be used to form a tunnel junction with n-doped layers of InP, AlInAs, or with lower bandgap materials such as AlInGaAs or InGaAsP. Such tunnel junctions are useful for producing long wavelength VCSELs.

20 Claims, 4 Drawing Sheets

U.S. PATENT DOCUMENTS

| | | | |
|---|---|---|---|
| 5,392,307 A | 2/1995 | Sugiyama et al. | |
| 5,416,044 A | 5/1995 | Chino et al. | |
| 5,422,901 A | 6/1995 | Lebby et al. | |
| 5,468,343 A | 11/1995 | Kitano | |
| 5,491,710 A | 2/1996 | Lo | |
| 5,513,204 A | 4/1996 | Jayaraman | |
| 5,568,504 A | 10/1996 | Kock et al. | |
| 5,588,995 A | 12/1996 | Sheldon | |
| 5,631,472 A | 5/1997 | Cunningham et al. | |
| 5,659,180 A | 8/1997 | Shen et al. | |
| 5,679,963 A * | 10/1997 | Klem et al. | 257/46 |
| 5,693,180 A | 12/1997 | Furukawa et al. | |
| 5,719,891 A | 2/1998 | Jewell | |
| 5,719,894 A | 2/1998 | Jewell et al. | |
| 5,719,895 A | 2/1998 | Jewell et al. | |
| 5,729,567 A | 3/1998 | Nakagawa | |
| 5,732,103 A | 3/1998 | Ramdani et al. | |
| 5,745,515 A * | 4/1998 | Marta et al. | 372/45 |
| 5,747,366 A | 5/1998 | Brillouet et al. | |
| 5,753,050 A | 5/1998 | Charache et al. | |
| 5,754,578 A | 5/1998 | Jayaraman | |
| 5,757,833 A | 5/1998 | Arakawa et al. | |
| 5,800,630 A | 9/1998 | Vilela et al. | |
| 5,805,624 A | 9/1998 | Yang et al. | |
| 5,809,051 A | 9/1998 | Oudar | |
| 5,815,524 A | 9/1998 | Ramdani et al. | |
| 5,818,862 A | 10/1998 | Salet | |
| 5,818,863 A | 10/1998 | Nabet et al. | |
| 5,825,796 A | 10/1998 | Jewell et al. | |
| 5,835,521 A | 11/1998 | Ramdani et al. | |
| 5,877,038 A | 3/1999 | Coldren et al. | |
| 5,883,912 A | 3/1999 | Ramdani et al. | |
| 5,898,722 A | 4/1999 | Ramdani et al. | |
| 5,903,586 A | 5/1999 | Ramdani et al. | |
| 5,912,913 A | 6/1999 | Kondow et al. | |
| 5,943,357 A | 8/1999 | Lebby et al. | |
| 5,943,359 A | 8/1999 | Ramdani et al. | |
| 5,956,363 A | 9/1999 | Lebby et al. | |
| 5,960,018 A | 9/1999 | Jewell et al. | |
| 5,974,073 A | 10/1999 | Canard et al. | |
| 5,978,398 A | 11/1999 | Ramdani et al. | |
| 5,985,683 A | 11/1999 | Jewell | |
| 5,991,326 A | 11/1999 | Yuen et al. | |
| 5,995,529 A * | 11/1999 | Kurtz et al. | 372/45.01 |
| 6,021,147 A | 2/2000 | Jiang et al. | |
| 6,046,065 A | 4/2000 | Goldstein et al. | |
| 6,049,556 A | 4/2000 | Sato | |
| 6,052,398 A | 4/2000 | Brillouet et al. | |
| 6,057,560 A | 5/2000 | Uchida | |
| 6,061,380 A | 5/2000 | Jiang et al. | |
| 6,061,381 A | 5/2000 | Adams et al. | |
| 6,121,068 A | 9/2000 | Ramdani et al. | |
| 6,127,200 A | 10/2000 | Ohiso et al. | |
| 6,148,016 A | 11/2000 | Hegblom et al. | |
| 6,195,485 B1 | 2/2001 | Coldren et al. | |
| 6,207,973 B1 | 3/2001 | Sato et al. | |
| 6,226,349 B1 | 4/2001 | Cox et al. | |
| 6,252,896 B1 | 6/2001 | Tan et al. | |
| 6,314,118 B1 | 11/2001 | Jayaraman et al. | |
| 6,341,137 B1 | 1/2002 | Jayaraman et al. | |
| 6,359,920 B1 | 3/2002 | Jewell et al. | |
| 6,362,069 B1 | 3/2002 | Forrest et al. | |
| 6,366,597 B1 | 4/2002 | Yuen et al. | |
| 6,372,533 B2 | 4/2002 | Jayaraman et al. | |
| 6,424,669 B1 | 7/2002 | Jiang et al. | |
| 6,434,180 B1 | 8/2002 | Cunningham | |
| 6,542,530 B1 | 4/2003 | Shieh et al. | |
| 6,546,031 B1 | 4/2003 | Jewell et al. | |
| 6,556,602 B2 | 4/2003 | Rice et al. | |
| 6,566,688 B1 | 5/2003 | Zhang et al. | |
| 6,580,741 B2 | 6/2003 | Jiang et al. | |
| 6,603,784 B1 | 8/2003 | Johnson | |
| 6,621,842 B1 | 9/2003 | Dapkus | |
| 6,621,843 B2 | 9/2003 | Yoo et al. | |
| 6,628,685 B1 | 9/2003 | Shieh | |
| 6,642,070 B2 | 11/2003 | Jiang et al. | |
| 6,653,158 B2 | 11/2003 | Hall et al. | |
| 2001/0050934 A1 * | 12/2001 | Choquette et al. | 372/43 |
| 2002/0027232 A1 * | 3/2002 | Shigematsu et al. | 257/197 |
| 2002/0067748 A1 | 6/2002 | Coldren et al. | |
| 2002/0071464 A1 | 6/2002 | Coldren et al. | |
| 2002/0071471 A1 | 6/2002 | Kim et al. | |
| 2002/0075920 A1 | 6/2002 | Spruytte et al. | |
| 2002/0075929 A1 | 6/2002 | Cunningham | |
| 2002/0090016 A1 | 7/2002 | Coldren et al. | |
| 2002/0131462 A1 | 9/2002 | Line et al. | |
| 2003/0032252 A1 * | 2/2003 | Pan et al. | 438/312 |
| 2003/0053510 A1 | 3/2003 | Yuen et al. | |
| 2003/0086463 A1 | 5/2003 | Shin et al. | |
| 2003/0103543 A1 | 6/2003 | Moser et al. | |
| 2003/0118067 A1 | 6/2003 | Johnson | |
| 2003/0118068 A1 | 6/2003 | Johnson | |
| 2003/0118069 A1 | 6/2003 | Johnson | |
| 2003/0123501 A1 | 7/2003 | Johnson | |
| 2003/0123511 A1 | 7/2003 | Johnson | |
| 2003/0134448 A1 | 7/2003 | Ju et al. | |
| 2003/0156610 A1 | 8/2003 | Kwon | |
| 2003/0156611 A1 | 8/2003 | Kwon | |
| 2003/0156616 A1 | 8/2003 | Kwon | |
| 2003/0157739 A1 | 8/2003 | Jiang et al. | |
| 2003/0231680 A1 | 12/2003 | Burak | |
| 2004/0104403 A1 * | 6/2004 | Moll et al. | 257/183 |

FOREIGN PATENT DOCUMENTS

| | | |
|---|---|---|
| EP | 000715357 A1 * | 6/1996 |
| EP | 0 740 377 A1 | 10/1996 |
| EP | 0 740 377 B | 10/1996 |
| EP | 0 765 014 A1 | 3/1997 |
| EP | 0 822 630 A1 | 2/1998 |
| EP | 0882630 A1 | 2/1998 |
| EP | 0 874 428 B1 | 4/1998 |
| EP | 0 874 428 A2 | 10/1998 |
| EP | 0874428 A2 | 10/1998 |
| EP | 0 874 428 A3 | 11/1998 |
| EP | 0874428 A3 | 11/1998 |
| EP | 0 765 014 B1 | 7/1999 |
| EP | 0765014 B1 | 7/1999 |
| EP | 0 999 621 B1 | 11/1999 |
| EP | 0 975 073 A1 | 1/2000 |
| EP | 1 294 063 A1 | 3/2003 |
| JP | 57026492 A | 2/1982 |
| WO | WO 98/07218 A1 | 2/1998 |
| WO | WO 00/52789 A2 | 2/2000 |
| WO | WO 00/52789 A3 | 2/2000 |
| WO | WO 00/33433 A2 | 6/2000 |
| WO | WO 00/33433 A3 | 6/2000 |
| WO | WO 00/38287 A1 | 6/2000 |
| WO | WO 00/65700 A2 | 11/2000 |
| WO | WO 00/65700 A3 | 11/2000 |
| WO | WO 01/16642 A2 | 3/2001 |
| WO | WO 01/16642 A3 | 3/2001 |
| WO | WO 01/17076 A2 | 3/2001 |
| WO | WO 01/17076 A3 | 3/2001 |
| WO | WO 01/18919 A1 | 3/2001 |
| WO | WO 01/24328 A2 | 4/2001 |
| WO | WO 01/24328 A3 | 4/2001 |
| WO | 01/33677 A2 | 5/2001 |
| WO | 01/33677 A3 | 5/2001 |
| WO | WO 01/33677 A2 | 5/2001 |
| WO | WO 01/33677 A3 | 5/2001 |
| WO | WO 01/52373 A2 | 7/2001 |
| WO | WO 01/52373 A3 | 7/2001 |
| WO | WO 01/63708 A2 | 8/2001 |

| WO | WO 01/84682 A2 | 11/2001 |
| WO | WO 01/93387 A2 | 12/2001 |
| WO | WO 01/93387 A3 | 12/2001 |
| WO | WO 01/95444 A2 | 12/2001 |
| WO | WO 01/98756 A2 | 12/2001 |
| WO | WO 02/03515 A2 | 1/2002 |
| WO | WO 02/17445 A1 | 2/2002 |
| WO | WO 02/084829 A1 | 10/2002 |
| WO | WO 03/052797 A1 | 6/2003 |

OTHER PUBLICATIONS

M.J. Cherng et al., J. Electron. Mater. 13, 799 (1984), "GaAs1-xSbx growth by OMVPE".*

McDermott et al. (Growth and doping of GaAsSb via metalorganic chemical vapor deposition for InP heterjunction bipolar transistors in Appl. Phys. Lett., vol. 68, No. 10, Mar. 4, 1996).*

Akiyama, Y., et al., "Growth of High Quality GaAs Layers on Si Substrates by Mocvd". 1986, Journal of Crystal Growth, pp. 490-497.

Almuneau, G., et al., "Accurate control of Sb composition in AlGaAsSb alloys on InP substrates by molecular beam epitaxy", article, May 6, 1999, pp. 113-116, vol. 208, Journal of Crystal Growth.

Almuneau, G., et al., "Improved electrical and thermal properties of InP-AlGaAsSb Bragg mirrors for long-wavelength vertical-cavity laser", article, Oct. 2000, pp. 1322-1324, vol. 12, No. 10, IEEE Photonics Technology Letters.

Almuneau, G., et al., "Molecular beam epitaxial growth of monolithic 1.55 µm vertical cavity surface emitting lasers with AlGaAsSb/AlAsSb Bragg mirrors", article, May/Jun. 2000, pp. 1601-1604, vol. 8, No. 3, Journal of Vacuum Science Technology.

Anan, T., et al., "Continuous-wave operation of 1.30 µm GaAsSb/GaAs VCSELs", article, Apr. 26, 2001, pp. 566-567, vol. 37, No. 9; Electronic Letters.

Black, K., et al. "Double-fused 1.5 µm vertical cavity lasers with record high $T_o$ of 132K at room temperature", article, Oct. 1, 1998, pp. 1947-1949, vol. 34, No. 20, Electronics Letters.

Blum O., et al., "Electrical and optical characteristics of AlAsSb/BaAsSb distributed Bragg reflectors for surface emitting lasers", article, Nov. 27, 1995, pp. 3233-3235, vol. 67, No. 22, Applied Physics Letters.

Blum, O., et al., "Highly reflective, long wavelength AlAsSb/GaAsSb distributed Bragg reflector grown by molecular beam epitaxy on InP substrates", article, Jan. 16, 1995, pp. 329-331, vol. 66, No. 3, Applied Physics Letters.

Boucart, J., et al., "1mW CW-RT monolithic VCSEL at 1.55 µm", article, Jun. 1999, pp. 629-631, vol. 11, No. 6, IEEE Photonic Technology Letters.

Boucart, J., et al., "Metamorphic DBR and Tunnel-Junction Injection: A CW RT Monolithic Long-Wavelength VCSEL", May/Jun. 1999, pp. 520-529, IEEE Journal of Selected Topics in Quantum Electronics, vol. 5, No. 3.

Boucart, J., et al., "Optimization of the Metamorphic Growth of GaAs for long wavelength VCSELs", 1999, pp. 1015-1019, Journal of Crystal Growth 201/202.

Campbell, J., et al., "Quantum dot resonant cavity photodiode with operation near 1.3 µm wavelength", article, Jul. 17, 1997,pp.1337-1339, vol. 33, No. 15, Electronics Letters.

Chang, C., et al., "Parasitics and design considerations on oxide-implant VCSELs", article, Dec. 2001, pp. 1274-1276, vol. 13, No. 12, IEEE Photonics Technology Letters.

Chertouk, H., "Metamorphic InAlAs/InGaAs HEMTs on GaAs substrates with a novel composite channels design", article, Jun. 1996, pp. 273-275, vol. 17, No. 6, IEEE Electron Device Letters.

Choquette, K., et al., "Room temperature continuous wave InGaAsN quantum well vertical-cavity lasers emitting at 1.3 µm", article, Aug. 3, 2000, pp. 1388-1390, vol. 36, No. 16, Electronics Letters.

Demeester, A., et al., "GaAs on InP: a promising material combination", article, Mar. 1989, pp. 44-48, Chemtronics vol. 4.

Dowd, P., et al., "Long wavelength (1.3 and 1.5 µm) photoluminscence from InGaAs/GaPAsSb quantum wells grown on GaAs", article, Aug. 30, 1999, pp. 1267-1269, vol. 75, No. 9, Applied Physics Letters.

Dudley, J., et al., "Water fused long wavelength vertical cavity lasers", conference proceedings, Nov. 15-18, 1993, pp. 560-561, LEOS '93 Conference Proceedings, IEEE Lasers and Electro-Optics Society 1993 Annual Meeting.

Goldstein, L., et al., "GaAlAs/GaAs metamorphic Bragg mirror for long wavelength VCSELs", article, Feb. 5, 1998, Lov. 34, No. 3, Electronics Letters.

Gourley, F., et al., "Epitaxial semiconductor optical interference devices", invited paper, 1987, pp. 178-189, vol. 792, SPIE.

Guden, M., et al., "Material parameters of quaternary III-V semiconductors for multiplayer mirrors at 1.55 µm wavelength", article, 1996, pp. 349-357, vol. 4, Modelling Simulation Material Science Engineering, United Kingdom.

Guo, C., et al., "Theoretical investigation of strained InGaAs/GaPAsSb type-II quantum wells on GaAs for long wavelength (1.3 um) optoelectronic devices", post-conference paper, Apr. 1999, pp. 30-31, Dept of Electrical Engineering & Center for Solid State Electronics Research, ASU, Tempe, AZ.

Guy, D., et al., "Theory of an electro-optic modulator based on quantum wells in a semiconductor □talon", conference paper, Mar. 23-24, 1987, pp. 189-196, Quantum Well and Superlattice Physics.

Hall, E., et al., "Electrically-pumped, single-epitaxial VCSELs at 1.55 µm with Sb-based mirrors", article, Aug. 5, 1999, pp. 1-2, vol. 35, No. 16, Electronics Letters.

Hall, E., et al., "Increased lateral oxidation rates of AlInAs on InP using short-period superlattices", article, Jan. 8, 2002, pp. 1100-1104, vol. 29, No. 9, Applied Physics Letters.

Hall, E., et al., "Selectively etched undercut apertures in AlAsSb-based VCSELs", article, Feb. 2001, pp. 97-99, vol. 13, No. 2, IEEE Photonics Technology Letters.

Hegblom, E., et al., "Small efficient vertical cavity lasers with tapered oxide apertures", article, Apr. 30, 1998, pp. 895-896, vol. 34, No. 9, Electronics Letters.

Heroux, J., et al., "Optical investigation of InGaAsN/GaAs strained multi-quantum wells", Oct. 1-3, 2001, p. 2, 20th North American Conference on Molecular Beam Epitaxy.

Hong, Y., et al., "Improving Ga(In)Nas properties by migration-enhanced epitaxy and superlattices", Jun. 27, 2001, 43rd 2001 Electronic Material Conference, Session G, Paper G10.

Hong, Y., et al., "Growth of GaInNAs quaternaries using a digital allow technique", conference paper, Oct. 1-3, 2001, pp. 1163-1166, Journal of Vacuum Science and Technology B: Microelectronics and Nanometer Structures.

Huffaker, D., et al., "1.15 µm wavelength oxide-confined quantum-dot vertical-cavity surface-emitting laser", article, Feb. 1998, pp. 185-187, vol. 10, No. 2, IEEE Photonics Technology Letters.

Huffaker, D., et al., "1.3 µm room-temperate GaAs-based quantum-dot laser", Nov. 2, 1998, pp. 2564-2566, vol. 73, No. 18, Applied Physics Letters.

Iga, K., "Semiconductor laser in the 21st century", California conference papers, Jan. 22-24, 2001, pp. xi-xxv, Photodetectors: Materials and Devices VI.

Jayaraman, V., et al., "Uniform threshold current, continuous-wave, single mode 1300 nm vertical cavity lasers from 0 to 70° C.", article, Jul. 9, 1998, pp. 1405-1407, vol. 34, No. 14, Electronics Letters.

Kim, J., et al., "Epitaxially-stacked multiple-active-region 1.55 µm lasers for increased differential efficiency", article, May 31, 1999, pp. 3251-3253, vol. 74, No. 22, Applied Physics Letters.

Kim, J., et al., "Room-temperature, electrically-pumped multiple-active-region VCSELs with high differentual efficiency at 1.55 µm", article, Jun. 24, 1999, pp. 1-2, vol. 35, No. 13, Electronics Letters.

Kondow, M., et al., "A Novel Material of GaInNAs for Long-Wavelength-Range Laser Diodes with Excellent High-Temperature Performance", Extended Abstracts of the 1995 International Conference on Solid State Devices and Materials, Osaka, 1995, pp. 1016-1018.

Kondow, M., et al., "GaInNAs: A Novel Material for Long-Wavelength-Range Laser Diodes with Excellent High-Temperature Performance", Feb. 1996, Jpn. J. Appl. Phys., vol. 35, pp. 1273-1275.

Kotaki, Y., et al., "GaInAsP/InP surface emitting laser with two active layers", article, 1984, pp. 133-136, Extended Abstracts of the 16th (1984 International) conference on Solid State Devices and Materials.

Koyama, F., et al., "Room temperature CWS operation of GaAs vertical cavity surface emitting laser", article, Nov. 1988, pp. 1089-1090, vol. E71, No. 11, The Transactions of the IEICE.

Larson, J., et al., "GaInNAs-GaAs long-wavelength vertical-cavity surface emitting laser diodes", article, Feb. 1998, pp. 188-190, vol. 10, No. 2, IEEE Photonics Technology Letters.

Lee, Y., et al., "Physics and nonlinear device applications of bulk and multiple quantum well GaAs", invited paper, 1987, pp. 128-133, SPIE vol. 792 Quantum Well and Superlattice Physics (1987).

Li, J., et al., "Persistent photoconductivity in $Ga_{1-x}In_x N_y As_{1-y}$", article, Sep. 27, 1999, pp. 1899-1901, vol 75, No. 13, Applied Physics Letters.

Livshits, E., "8W continuous wave operation of InGaAsN lasers at 1,3 μm", article, Aug. 3, 2000, pp. 1381-1382, vol. 36, No. 16, Electronics Letters.

Mirin, R., et al., "1.3 μm photoluminescence from InGaAs quantum dots on GaAs", article, Dec. 18, 1995, pp. 3795-3797, Applied Physics Letter 67 (25).

Nakagawa, S., et al., "1.55 μm InP-lattice-matched VCSELs with AlGaAsSb-AlAsSb DBRs", article, Mar./Apr. 2001, pp. 224-230, vol. 7, No. 2, IEEE Journal on Selected Topics in Quantum Electronics.

Nakahara, K., et al., "1.3 μm continuous-wave lasing operation in GaInNAs quantum-well lasers", article, Apr. 1998, pp. 487-488, vol. 10, No. 4, IEEE Photonics Technology Letters.

Nakahara, K., et al., "Continuous-wave operation of long-wavelength GaInNAs/GaAs quantum well laser", article, Jun. 13, 1996, pp. 1585-1586, vol. 32, No. 17, IEE Electronics Letters Online No. 19961039.

Naone, R., et al., "Tapered air apertures for thermally robust VCL structures", article, Nov. 1999, pp. 1339-1341, vol. 11, No. 11, IEEE Photonics Technology Letters.

Nelson, D., et al., "Band nonparabolicity effects in semiconductor quantum wells", article, Feb. 15, 1987, pp. 7770-7773, vol. 35, No. 17, Rapid Communications.

Ohnoki, N., et al., "Superlattive AlAs/AlInAs-oxide current aperture for long wavelength InP-based vertical-cavity surface-emitting laser structure", article, Nov. 30, 1998, pp. 3262-3264, vol. 73, No. 22, Applied Physics Letters.

Ortsiefer, M., et al., "Submiliamp long-wavelength InP-based vertical-cavity surface-emitting laser with stable linear polarization", article, Jun. 22, 2000, pp. 1124-1126, vol. 36, No. 13, Electronics Letters.

Peters, M., et al., "Realization and modeling of a pseudomorphic $(GaAs_{1-x}Sb_x In_y Ga_{1-y}As)/GaAs$ bilayer-quantum well", article, Oct. 30, 1995, pp. 2639-2641, Applied Physics Letter 67 (18).

Peters, M., et al., "Band-gap engineered digital alloy interfaces for lower resistance vertical-cavity surface-emitting lasers, article, Dec. 1993, pp. 3411-3413, vol. 63, No. 25, Applied Physics Letters.

Piprek, J., et al., "Thermal comparison of long-wavelength vertical-cavity surface-emitting laser diodes", May 26, 1994, pp. 866-868, vol. 30, No. 11, Electronics Letters.

Piprek, J., et al., "Minimum temperature sensitivity of 1.55 μm vertical-cavity lasers at -30 nm gain offset", article, Apr. 13, 1998, pp. 1814-1816, vol. 72, No. 15, Applied Physics Letters.

Raja, M., et al., "Novel wavelength-resonant optoelectronic structure and its application to surface-emitting semiconductor lasers", article, Sep. 1, 1988, pp. 1140-1142, vol. 24, No. 18, Electronics Letters.

Scott, J., et al., "High efficiency submilliamp vertical cavity lasers with intracavity contacts", article, Jun. 1994, pp. 678-680, vol. 6, No. 6, IEEE Photonics Technology Letters.

Sekiguchi, S., et al., "Long wavelength GaInAsP/InP laser with n-n contacts using AlAs/InP hole injecting tunnel junction", article, Apr. 15, 1999, pp. L443-L445, Part 2, No. 4B, Japanese Journal of Applied Physics.

Shimomura, H., et al., "High-reflectance ALPSb/GaPSb distributed Bragg reflector mirrors on InP grown by gas-source molecular beam epitaxy", article, Dec. 20, 1993, Electronics Letters Online No. 19940230.

Starck, C., "Fabrication of 1.55 um oxidized VCSELs with top metamorphic GaAs/GaAlAs and bottom InP/InGaAsP Bragg reflectors", May 15, 1998, 10th International Conference on Indium Phosophide and Related Materials, pp. 369-372.

Starck, C., "Long wavelength VCSEL with tunnel junction and metamorphic AlAs/GaAs conductive DBR", article, Jan. 15, 1989, pp. 1871-1883, vol. 39, No. 3, Physics Review B.

Sugimoto, M., et al., "Surface emitting devices with distribut4ed Bragg reflectors grown by highly precise molecular beam epitaxy", article, 1993, pp. 1-4, vol. 127, Journal of Crystal Growth.

Strassburg, M, Growth and p-type doping of ZnSeTe on InP, Technische Universitat Berlin, Institut fur Festkorperphysik, 10623 Berlin, Germany, National Technical University, Faculty of Applied Sciences, 15780 Athens, Greece, ICMOVPE XI WEB-BOOKLET May 17, 2002.

Uchida, T., et al., "CBE grown 1.5 μm GaInAsP-InP surface emitting lasers", article, Jun. 1993, pp. 1975-1980, vol. 29, No. 6, IEEE Journal of Quantum Electronics.

Van De Walle, C. "Band lineups and deformation potentials in the model-solid theory", article, Jan. 15, 1989, pp. 1871-1883, vol. 39, No. 3, Physical Review B.

Whitaker, T., "Long wavelength VCSELs move closer to reality", article, Jul. 2000, pp. 65-67, Compound Semiconductor.

Wipiejewski. T. Improved performance of vertical-cavity surface-emitting laser diodes with Au-plated heat spreading layer, REPRINTED from electronic letters, Feb. 16, 1995, vol. 31 No. 4 pp. 279-280.

Yamada, M., et al., "Low-threshold lasing at 1.3 μm from GaAsSb quantum wells directly grown on GaAs substrates", article, Apr. 1998, pp. 149-150, IEEE, 0-7803-4947.

Yamada, M., et al., "Room temperature low-threshold CW operation of 1.23 μm GaAsSb VCSELs on GaAs substrates", article, Mar. 30, 2000, pp. 637-638, vol. 36, No. 7, Electronics Letters.

Yang, X., et al., "High performance 1.3 μm InGaAsN:Sb/GaAs quantum well lasers grown by molecular beam epitaxy", journal article, Oct. 1999, pp. 1484-1487, vol. 18, No. 3, Journal of Vacuum Science and Technology B Microelectronics and Nanometer Structures.

Yang, X., et al., "High-temperature characteristics of 1.3 μm in InGaAsN:Sb/GaAs multiple-quantum-well lasers grown by molecular-beam epitaxy", article, Feb. 14, 2000, pp. 795-797, vol. 76, No. 7, Applied Physics Letters.

Yang, X., et al., "InGaAsNSb/GaAs quantum wells for 1.55 μm lasers grown by molecular-beam epitaxy", article, pp. 4068-4070, vol. 78, No. 26, Applied Physics Letters.

Yano, M., et al., "Time-resolved reflection high energy electron diffraction analysis for atomic layer depositions of GaSb by molecular beam epitaxy", article, 1995, pp. 349-353, vol. 146, Journal of Crystal Growth.

Yuen, W., et al., "High-performance 1.6 μm single-epitaxy top-emitting VCSEL", article, Jun. 22, 2000, pp. 1121-1123, vol. 36, No. 13, Electronics Letters.

Zeng, L. Red-green-blue photopumped lasing from ZnCdMgSe/ZnCdSe quantum well structures grown on InP, Received Mar. 10, 1998 accepted for publication, Apr. 15, 1998, 1998 American Institute of Physics. (S0003-6951(98)02524-8).

B.T. McDermott et al., Appl. Phys. Lett. 68,1386 (1996), "Growth and doping of GaAsSb via MOCVD for InP HBTs".

S.M. Bedair et al., J. Electron. Mater. 12,959 (1983), "Growth of GaAs(1-x)Sbx by OMVPE".

M.J. Cherng et al., J. Electron. Mater. 13,799 (1984). "GaAs1-xSbx growth by OMVPE".

S.P. Watkins et al., J. Cryst. Growth 221, 59 (2000), "Heavily carbon-doped GaAsSb grown on InP for HBT applications".

* cited by examiner

US 7,295,586 B2

CARBON DOPED GAASSB SUITABLE FOR USE IN TUNNEL JUNCTIONS OF LONG-WAVELENGTH VCSELS

STATEMENT OF GOVERNMENT RIGHTS

This invention was made with United States Government support under 70NAHBSI-14023 awarded by National Institute of Standards and Technology (NIST).

BACKGROUND OF THE INVENTION

1. Field of the Invention

This invention relates to vertical cavity surface emitting lasers (VCSELs). More specifically, it relates to tunnel junctions for long-wavelength VCSELS.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a wide range of material systems, distributed Bragg reflector (DBR) mirrors, current confinement structures, substrates, and contacts. Some VCSELs, particularly those used at long-wavelengths, incorporate tunnel junctions. Because of their complicated structure, and because of their material requirements, VCSELs are usually grown using metal-organic chemical vapor deposition (MOCVD).

FIG. 1 illustrates a typical long-wavelength VOSEL 10 having a tunnel junction. As shown, an n-doped InP substrate 12 has an n-typo electrical contact 14. An n-doped lower mirror stack 16 (a DBR) is on the InP substrate 12, and an n-type graded-index InP lower spacer 18 is disposed over the lower mirror stack 16. An InGaAsP or AlInGaAs active region 20, usually having a number of quantum wells, is formed over the InP lower spacer 18. Over the active region 20 is a tunnel junction 25. Over the tunnel junction 25 is an n-type graded-index InP top spacer 22 and an n-type InP top mirror stack 24 (another DBR), which is disposed over the InP top spacer 22. Over the top mirror stack 24 is an n-type conduction layer 9, an n-type cap layer 8, and an n-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonant at a predetermined wavelength (or at a multiple thereof). At least part of the top mirror stack 24 includes an insulating region 40 that provides current confinement. The insulating region 40 is usually formed either by implanting protons into the top mirror stack 24 or by forming an oxide layer. In any event, the insulating region 40 defines a conductive annular central opening 42 that forms an electrically conductive path though the insulating region 40.

In operation, an external bias causes an electrical current 21 to flow from the electrical contact 26 toward the electrical contact 14. The insulating region 40 and the conductive central opening 42 confine the current 21 such that the current flows through the conductive central opening 42 and into the tunnel junction 25. The tunnel junction converts incoming electrons into holes that are injected into the active region 20. Some of the injected holes are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the conduction layer 9, through the cap layer 8, through an aperture 30 in electrical contact 26, and out of the surface of the vertical cavity surface emitting laser 10.

It should be understood that FIG. 1 illustrates a typical long wavelength VCSEL having a tunnel junction, and that numerous variations are possible. For example, the dopings can be changed (say, by providing a p-type substrate), different material systems can be used, operational details can be tuned for maximum performance, and additional structures and features can be added.

While generally successful, VCSELs similar to that illustrated in FIG. 1 have problems. One problem in realizing commercial quality long wavelength VCSELs is the available mirror materials. Since long wavelength VCSELs are often based on InP, for proper lattice matching InP/InGaAsP or AlInAs/AlInGaAs mirrors are often used. However, because those materials have relatively low refractive index contrasts, 40-50 mirror pairs are typically needed to achieve the required high reflectivity. Growing that number of mirror pairs takes a long time, which increases the production costs.

Another problem, which is addressed by the tunnel junction 25, is optical loss. In long wavelength VCSELs it is often critical to limit optical losses. To that end, p-doped materials, which absorb more light than n-doped materials, are replaced by n-doped materials and the tunnel junction 25. That junction converts holes into electrons that are injected into the active region.

Tunnel junctions used in semiconductor lasers are thin (say 10 nanometer), reversed biased structures. Such tunnel junctions are usually n++/p++ structures in which the p-region is highly doping (greater than $1 \times 10^{19}$ cm$^{-3}$) using a low diffusivity dopant such as carbon. This enables a low voltage drop in a device having low free carrier absorption and sufficient free carriers.

Prior art semiconductor laser tunnel junctions have been reported using MBE-grown Be-doped InGaAsP or MOCVD grown C-doped AlAs. However, the reported doping in InGaAsP appears insufficient, while the strain of AlAs on InP materials appears excessive. Thus, a new long wavelength VCSEL would be beneficial. Even more beneficial would be a new tunnel junction suitable for use in long wavelength VCSELs. Still more beneficial would be new tunnel junctions that use MOCVD-grown layers and that are suitable for use in long wavelength VCSELs.

SUMMARY OF THE INVENTION

Accordingly, the principles of the present invention are directed to a new tunnel junction suitable for use in long wavelength VCSELs. Beneficially, the principles of the present invention relate to MOCVD-grown tunnel junctions.

The principles of the present invention specifically provide for growing GaAs$_{(1-x)}$Sb$_x$ using MOCVD. For lattice matching with InP, x is beneficially set to 0.5 (producing a bandgap of 0.71 eV at 300 K). Beneficial alternatives include setting x to 0.23, 0.3, and 0.4. During MOVCD, TMGa (or TEGa), TMSb, and AsH$_3$ (or TBAs) are used to produce the tunnel junction. Beneficially, the solid composition is controlled by controlling the ratio of As to Sb. The MOCVD growth temperature is between 500° C. and 650°

C., while doping is beneficially performed using $CCl_4$ or $CBr_4$. The resulting p-doping can be as high as $1 \times 10^{20}$ cm$^{-3}$ without annealing.

A tunnel junction according to the principles of the present invention is comprised of heavily doped $GaAs_{(1-x)}Sb_x$ and an n-doped layer of InP, AlInAs, or of a lower bandgap material such as AlInGaAs or InGaAsP. Beneficially, such a tunnel junction is formed above quantum wells to produce a VCSEL. Such VCSELs are particularly advantageous at long wavelengths.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and which are incorporated in and constitute a part of this specification, illustrate embodiments of the invention and together with the description serve to explain the principles of the invention.

In the drawings.

Figure 1:
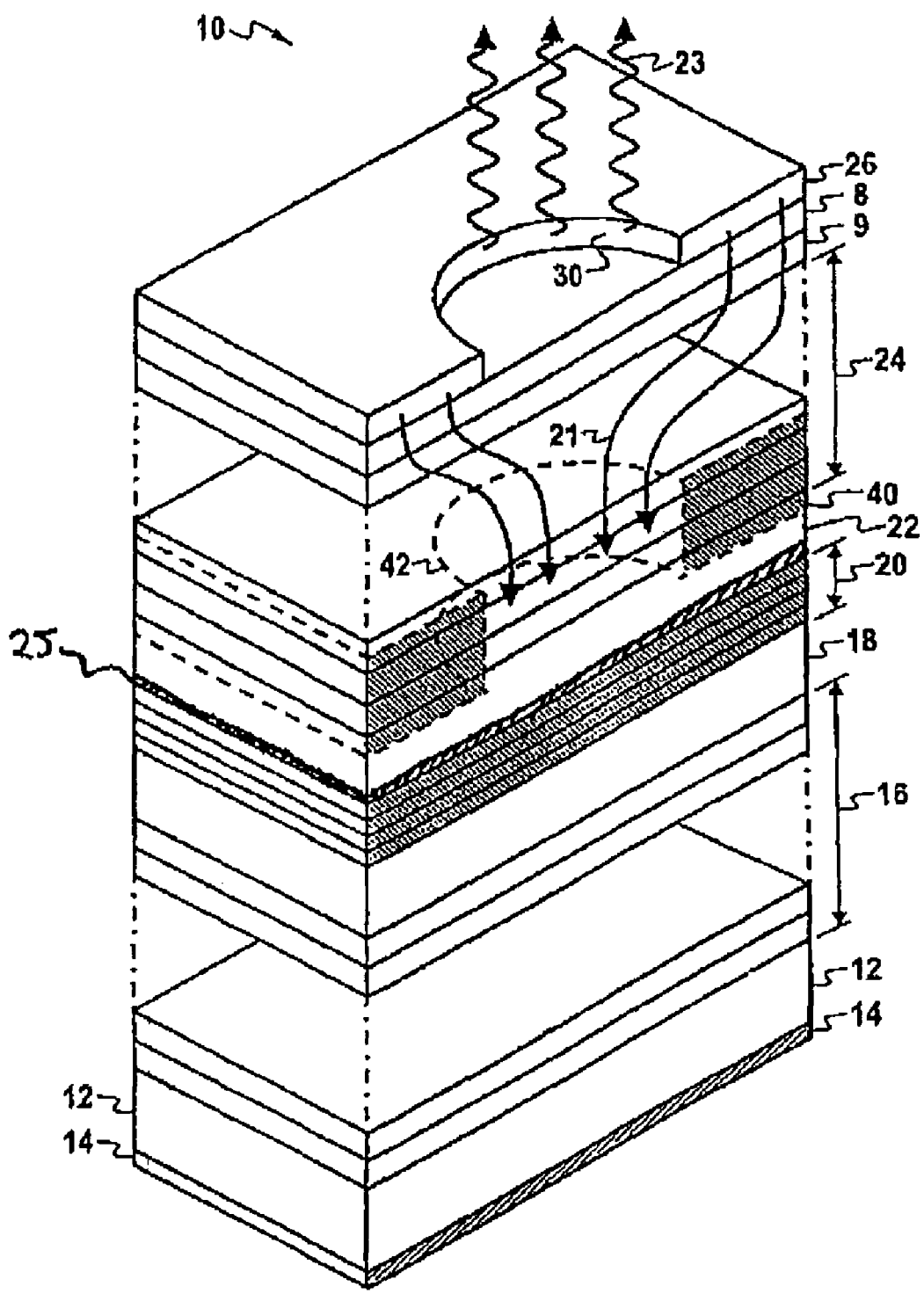
FIG. 1 illustrates a typical long-wavelength vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

The principles of the present invention are incorporated in a first embodiment VCSEL having a bottom AlGaInAs/AlInAs DBR mirror grown on an InP substrate. An example of such a VCSEL is the VCSEL 100 illustrated in FIG. 2.

Figure 2:
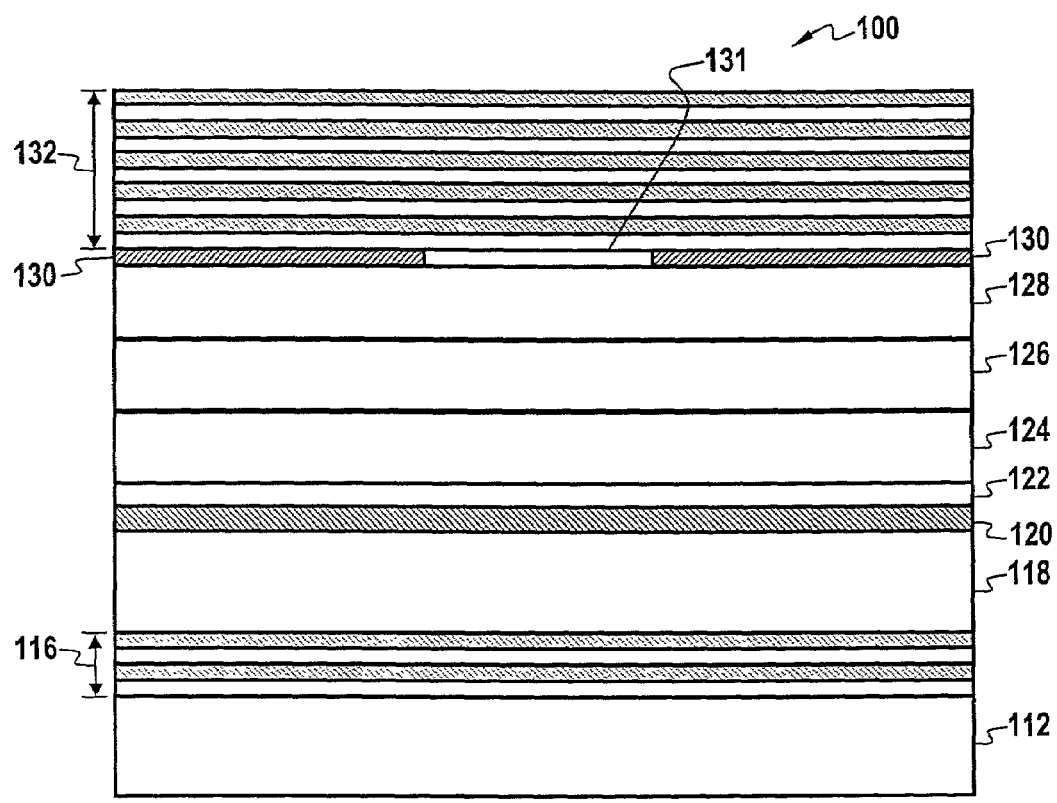
FIG. 2 illustrates a vertical cavity surface emitting laser that is in accord with the principles of the present invention.

As shown in FIG. 2, the VCSEL 100 includes an n-doped InP substrate 112 having an n-type electrical contact (not shown for clarity). Over the InP substrate 112 is an n-doped lower mirror stack 116 (a DBR) comprised of a plurality of alternating layers of AlGaInAs/AlInAs. Over the lower mirror stack 116 is an n-doped InP spacer 118. The lower mirror stack 116 is beneficially grown on the InP substrate using common metal-organic and hydride sources like TMAl, TNGa, $PH_3$ and $AsH_3$ in an MOCVD process. Then, the InP spacer 118 is grown, also using MOCVD. An active region 120 comprised of P-N junction structures and having a large number of quantum wells is then formed over the InP spacer 118. The composition of the active region 120 is beneficially InGaAsP or AlInGaAs.

Over the active region 120 is a tunnel junction 122 comprised of a reverse biased n++/p++ junction. Beneficially, the tunnel junction includes a p-layer comprised of MOCVD-grown $GaAs_{(1-x)}Sb_x$. During MOVCD, TMGa (or TEGa), TMSb, and $AsH_3$ (or TBAs) are beneficially used to produce the $GaAs_{(1-x)}Sb_x$ layer. Beneficially, that layer's solid composition is controlled by controlling the ratio of As to Sb. The MOCVD growth temperature is between 500° C. and 650° C. Doping is beneficially performed using $CCl_4$ or $CBr_4$ such that the resulting p-doping is greater $1 \times 10^{19}$cm$^{-3}$. In practice, a p-doping greater than $5 \times 10^{19}$cm$^{-3}$ is beneficial. It should be noted that the $GaAs_{(1-x)}Sb_x$ layer can have a doping as high as $1 \times 10^{20}$ cm$^{-3}$ without annealing.

By setting x=0.5 a tunnel junction that is lattice matched to InP is produced (but $GaAs_{(0.5)}Sb_{0.5}$ has a bandgap of 0.71 eV at 300 K). An alternative is to set x=0.4, 0.3, or 0.23, which produce $GaAs_{(1-x)}Sb_x$ layers with bandgaps of 0.8 eV, 0.91 eV, or 1 eV, but which are not lattice matched to the InP active region 120. At x=0.3, or 0.23 the strains respectively become 1.4% or 1.95%, which, while not ideal, are much better than the 3.55% strain of AlAs on InP.

The tunnel junction 122 further includes an n-doped layer of InP), AlInAs, or of a lower bandgap material such as AlInGaAs or InGaAsP. The n-doped layer should also be heavily doped (greater than $5 \times 10^{19}$ cm$^{-3}$) and very thin (less than about 10 nanometers). For good lattice matching, the VCSEL 100 uses an InP n-type layer in the tunnel junction 122.

Over the tunnel junction 122 is an n-type InP top spacer 124. Then, an n-type top mirror structure (which includes another DBR) is disposed over the top spacer 124. The top mirror structure is beneficially comprised of a low temperature grown GaAs buffer layer 126 over the top spacer 124, a high temperature GaAs buffer layer 128 (which acts as a seed layer) over the GaAs buffer layer 126, an insulating structure (beneficially comprised of $SiO_2$) 130 over most of the GaAs buffer layer 128, and a GaAs/Al(Ga)As mirror stack 132 over the insulating structure 130. As shown, the insulating structure includes an opening 131, which enables current flow through the VCSEL 100.

The top mirror structure implements a device quality GaAs/Al(Ga)As mirror stack 132 over the top spacer 124. In many applications, GaAs/Al(Ga)As is considered the best material for Bragg mirrors because of its high refractive index contrast (GaAs:AlAs=3.377:2.893), high thermal conductivity (GaAs:AlAs=0.46:0.8), and its oxidation potential. However, GaAs/Al(Ga)As is seriously lattice mismatched with InP. Thus, to produce a device-quality GaAs/Al(Ga)As mirror stack, MOCVD is used in a two-step process to form intermediate GaAs buffer layers.

Figure 3:
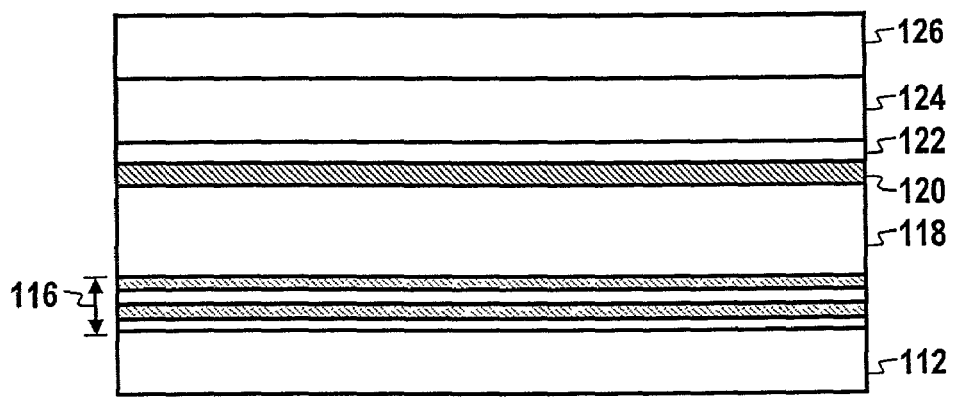
FIG. 3 illustrates an intermediate structure during fabrication of the vertical cavity surface emitting laser illustrated in FIG. 2.

FIG. 3 illustrates the first step of the two-step process. A low temperature GaAs buffer layer 126 is formed over the InP spacer 124. The low temperature GaAs buffer layer 126 is produced by adjusting the MOCVD growth temperature to about 400-450° C., and then MOCVD growing the low temperature GaAs buffer layer 126 to a thickness of about 20-40 nm.

Figure 4:
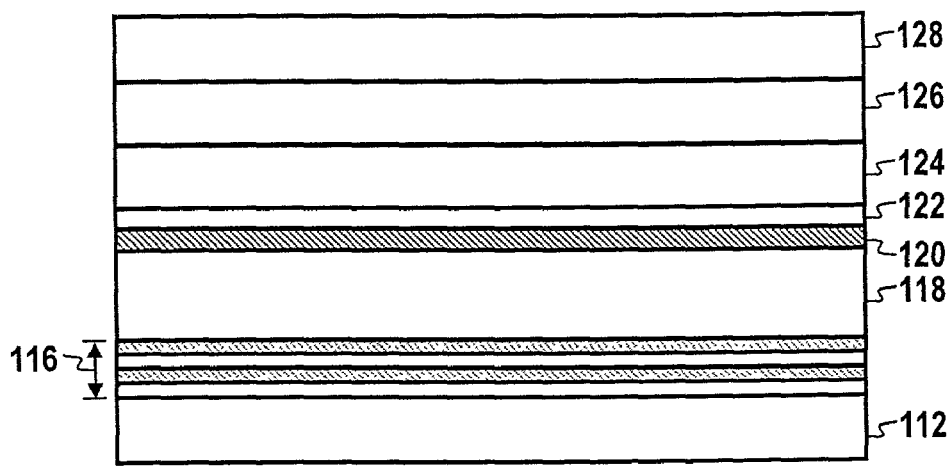
FIG. 4 illustrates another intermediate structure during fabrication of the vertical cavity surface emitting laser illustrated in FIG. 2.

Referring now to FIG. 4, after the low temperature GaAs buffer layer 126 is formed, the temperature is increased to around 600° C. Then, the high temperature GaAs buffer layer 128 is grown. The GaAs buffer layer 128 acts as a seed layer for subsequent growths.

Figure 5:
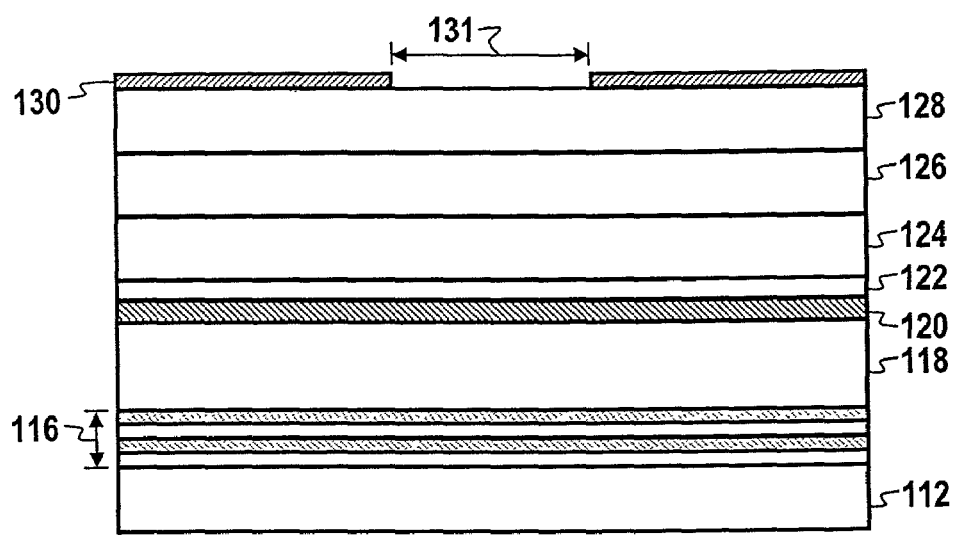
FIG. 5 illustrates yet another intermediate structure during fabrication of the vertical cavity surface emitting laser illustrated in FIG. 2.

Referring now to FIG. 5, after the GaAs buffer layer 128 is grown, a dielectric layer of $SiO_2$ (alternatively of $Si_3N_4$) is deposited and patterned to form the insulating structure 130. To do so, the intermediate structure shown in FIG. 4 is removed from the MOCVD reactor vessel. Then, a dielectric layer of $SiO_2$ (alternatively $Si_3N_4$) is deposited on the insulating structure 130. Then, the deposited dielectric layer is patterned to produce the insulating structure 130 having the opening 131. The insulating structure 130 provides a suitable surface for lateral epitaxial overgrowth. After the insulating structure 130 formed, the intermediate structure of FIG. 5 is inserted into the MOCVD reactor vessel.

Referring once again to FIG. 2, the GaAs/Al(Ga)As mirror stack 132 is then grown by MOCVD. That mirror stack is produced by lateral epitaxial overgrowth from the GaAs buffer layer 128 through the opening 131. The result is a high-quality mirror stack 132 having current confinement.

With the mirror stack 132 formed, an n-type conduction layer (similar to the p-type conduction layer 9 of FIG. 1), an n-type GaAs cap layer (similar to the p-type GaAs cap layer 8 of FIG. 1), and an n-type electrical contact (similar to the p-type electrical contact 26 of FIG. 1) are produced.

Figure 6:
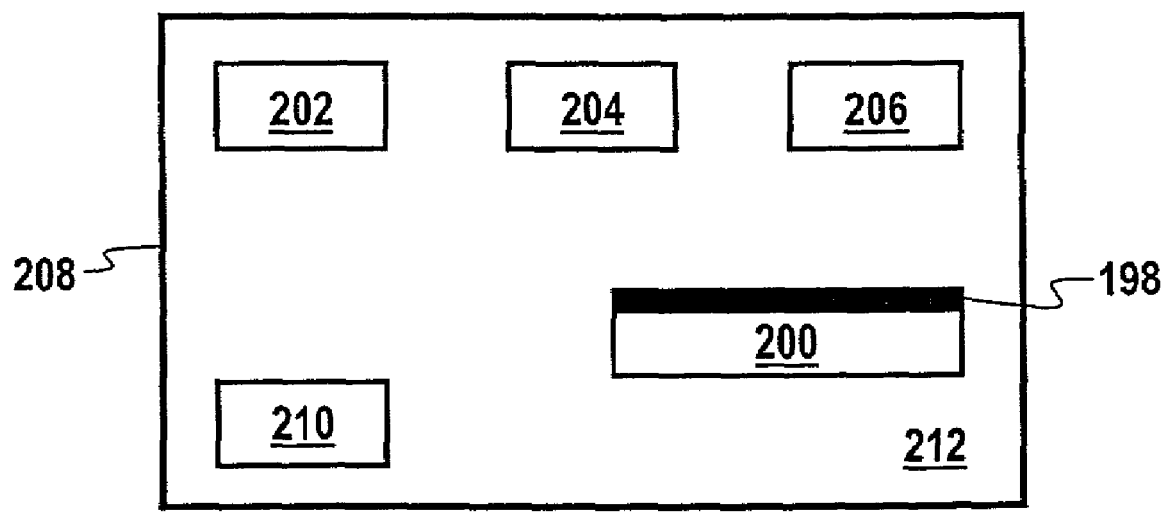
FIG. 6 illustrates forming the tunnel junction used in the vertical cavity surface emitting laser illustrated in FIG. 2

FIG. 6 helps explain a method of fabricating the tunnel junction's MOCVD-grown p-doped $GaAs_{(1-x)}Sb_x$ layer. An intermediate structure 200 having an InP top surface 196 is in an MOCVD chamber 208. That chamber includes sources for Ga, Sb, and As. The Ga source 202 is beneficially either TMGa or TEGa. The Sb source 204 is beneficially TMSb, while the As source 206 is beneficially $AsH_3$ or TBAs. The composition of the $GaAs_{(1-x)}Sb_x$ layer is beneficially controlled by controlling the ratio of As to Sb. The MOCVD growth temperature is set between 500° C. and 650° C. using a thermometer 210. The doping of the $GaAs_{(1-x)}Sb_x$ layer is beneficially controlled using an atmosphere 212 containing $CCl_4$ or $CBr_4$. In practice, a p-doping greater than $5 \times 10^{19}$ $cm^{-3}$ is beneficial. Further, while a minimum doping of $1 \times 10^{19}$ $cm^{-3}$ is anticipated, it should be noted that the $GaAs_{(1-x)}Sb_x$ layer can have a doping as high as $1 \times 10^{20}$ $cm^{-3}$ without annealing.

By setting x=0.5 a tunnel junction that is lattice matched to InP is produced (but $GaAs_{(0.5)}Sb_{0.5}$ has a bandgap of 0.71 eV at 300 K). An alternative is to set x=0.4, 0.3, or 0.23, which produce $GaAs_{(1-x)}Sb_x$ layers with bandgaps of 0.8 eV, 0.91 eV, or 1 eV, but which are not lattice matched to the InP active region 120. At x=0.3, or 0.23 the strains respectively become 1.4% or 1.95%, which, while not ideal, are much better than the 3.55% strain of AlAs on InP. The tunnel junction 122 is further fabricated with a heavily n-doped (greater than $5 \times 10^{19}$ $cm^{-3}$) and very thin (less than about 10 nanometers) InP (AlInAs or of a lower bandgap material such as AlInGaAs or InGaAsP can also be used).

The VCSEL 100 has significant advantages over prior art long wavelength InP VCSELs. First, the two-step MOCVD process enables a device quality GaAs/Al(Ga)As top mirror to be used with an InGaAsP or AlInGaAs active region 120 and an InP top spacer 124. Another advantage is that the tunnel junction 122 enables n-doped top layers to be used, which reduces optical absorption (which can be critically important in long wavelength VCSELs). That tunnel junction 122 is comprised of a MOCVD-grown, heavily p-doped $GaAs_{(1-x)}Sb_x$ layer 198. Yet another advantage is the avoidance of InP/InGaAsP and AlInAs/AlInGaAs mirror stacks, which require larger numbers of mirror pairs. Consequently, a reduction in mirror growth times and costs is possible. Furthermore, the mirrors stacks used in the VCSEL 100 enable improved thermal performance. Still another advantage is the ease of forming current confinement in the top mirror structure, and the use of lateral epitaxial overgrowth to produce the top mirror. The overall result is a VCSEL having improved performance, increased reliability, faster fabrication, and reduced cost.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a vertical cavity surface emitting laser (VCSEL) with a tunnel junction, the method comprising:

locating a substrate in an MOCVD chamber;
forming an active region over the substrate, the active region having a plurality of quantum wells;
setting a temperature of the MOCVD chamber between 500° C. and 650° C.; and
growing a tunnel junction including $GaAs_{(1-x)}Sb_x$ over the active region using an MOCVD process in which a source of Ga, a source of Sb, and a source of As are present.

2. The method according to claim 1, wherein x has a value corresponding to a ratio of As to Sb.

3. The method according to claim 2, wherein the value of x is 0.5.

4. The method according to claim 2, wherein the value of x is less than 0.5.

5. The method according to claim 1, wherein the source of Ga is TMGa or TEGa, and the source of Sb is TMSb.

6. The method according to claim 1, wherein the source of As is $AsH_3$ or TBAs.

7. The method according to claim 1, further including carbon doping the $GaAs_{(1-x)}Sbx_x$ using $CCl_4$ or $CBr_4$.

8. A tunnel junction comprising:

a p-doped $GaAs_{(1-x)}Sb_x$ layer, wherein x is set at a value such that the p-doped $GaAs_{(1-x)}Sb_x$ layer is substantially lattice matched with an InP based active region and has a strain less than 1.95%; and
an n-doped layer of InP, AlInAs, AlInGaAs, or InGaAsP, wherein the n-doped layer is doped with a concentration greater than $5 \times 10^{19}$ $cm^{-3}$.

9. The tunnel junction according to claim 8, wherein the p-doped $GaAs_{(1-x)}Sb_x$ layer is doped with carbon with a concentration greater than $1 \times 1^{19}$ $cm^{-3}$.

10. The tunnel junction according to claim 8, wherein the $GaAs_{(1-x)}Sb_x$ layer is doped with a concentration greater than $5 \times 10^{19}$ $cm^{-3}$, and wherein the tunnel junction is less than about 10 nanometers thick.

11. The tunnel junction according to claim 8, wherein the n-doped layer is InP, and wherein x has a value of 0.5.

12. A vertical cavity surface emitting laser, comprising:
an active region having a plurality of quantum wells, and
a tunnel junction over said active region, wherein said tunnel junction includes a $GaAs_{(1-x)}Sb_x$ layer.

13. The vertical cavity surface emitting laser according to claim 12, further including an n-type bottom spacer adjacent the active region, and an n-type bottom DBR adjacent the n-type bottom spacer.

14. The vertical cavity surface emitting laser according to claim 12, further including an n-type top spacer adjacent the tunnel junction and an n-type top DBR adjacent the n-type top spacer.

15. The vertical cavity surface emitting laser according to claim 12, wherein the $GaAs_{(1-x)}Sb_x$ layer is grown by MOCVD.

16. The vertical cavity surface emitting laser according to claim 12, wherein the $GaAs_{(1-x)}Sb_x$ layer is doped with carbon with a concentration greater than $5 \times 10^{19}$ $cm^{-3}$.

17. The vertical cavity surface emitting laser according to claim 12, wherein said active region includes InGaAsP or AlInGaAs.

18. The vertical cavity surface emitting laser according to claim 17, wherein said tunnel junction includes an n-type InP layer.

19. The vertical cavity surface emitting laser according to claim 12, wherein x is 0.5.

20. The vertical cavity surface emitting laser according to claim 12, wherein the tunnel junction has a thickness of less than about 10 nm.

* * * * *

UNITED STATES PATENT AND TRADEMARK OFFICE
CERTIFICATE OF CORRECTION

PATENT NO.        : 7,295,586 B2
APPLICATION NO.   : 10/078473
DATED             : November 13, 2007
INVENTOR(S)       : Kwon It is certified that error appears in the above-identified patent and that said Letters Patent is hereby corrected as shown below:

Title page, item (56)
Page 1, Other Publications, Line 2, change "vis" to --via--
Page 3, Other Publications, Right hand side, Line 41, change "Ga(In)Nas" to --Ga(In)NAs--
Page 4, Right hand side, Line 12, change "distribut4ed" to --distributed--

Col. 1
Line 36, change "n-typo" to --n-type--

Col. 4
Line 7, change "greater" to --greater than--
Line 19, change "InP)," to --InP,--

Col. 5
Line 13, change "196" to --198--

Signed and Sealed this

Third Day of August, 2010

David J. Kappos
*Director of the United States Patent and Trademark Office*